US007643127B2

(12) United States Patent
Baselmans et al.

(10) Patent No.: US 7,643,127 B2
(45) Date of Patent: Jan. 5, 2010

(54) PREWETTING OF SUBSTRATE BEFORE IMMERSION EXPOSURE

(75) Inventors: Johannes Jacobus Matheus Baselmans, Oirschot (NL); Sjoerd Nicolaas Lambertus Donders, 's-Hertogenbosch (NL); Christiaan Alexander Hoogendam, Veldhoven (NL); Jeroen Johannes Sophia Maria Mertens, Duizel (NL); Johannes Catharinus Hubertus Mulkens, Waalre (NL); Bob Streefkerk, Tilburg (NL)

(73) Assignee: ASML Netherlands B.V., Veldhoven (NL)

( * ) Notice: Subject to any disclaimer, the term of this patent is extended or adjusted under 35 U.S.C. 154(b) by 28 days.

(21) Appl. No.: 11/709,834

(22) Filed: Feb. 23, 2007

(65) Prior Publication Data

US 2007/0159613 A1 Jul. 12, 2007

Related U.S. Application Data

(62) Division of application No. 11/005,219, filed on Dec. 7, 2004, now Pat. No. 7,196,770.

(51) Int. Cl.
*G03B 27/42* (2006.01)
*G03B 27/52* (2006.01)
*G03B 27/62* (2006.01)

(52) U.S. Cl. ............................. 355/53; 355/55; 355/75

(58) Field of Classification Search .................. 355/53, 355/55, 75, 72, 77; 427/58; 118/50; 250/548
See application file for complete search history.

(56) References Cited

U.S. PATENT DOCUMENTS

| 3,573,975 A | 4/1971 | Dhaka et al. ................. 117/212 |
| 3,648,587 A | 3/1972 | Stevens .......................... 95/44 |
| 4,346,164 A | 8/1982 | Tabarelli et al. .............. 430/311 |
| 4,390,273 A | 6/1983 | Loebach et al. .............. 355/125 |
| 4,396,705 A | 8/1983 | Akeyama et al. ............ 430/326 |

(Continued)

FOREIGN PATENT DOCUMENTS

DE        206 607        2/1984

(Continued)

OTHER PUBLICATIONS

M. Switkes et al., "Immersion Lithography at 157 nm", MIT Lincoln Lab, Orlando 2001-1, Dec. 17, 2001.

(Continued)

*Primary Examiner*—Peter B Kim
(74) *Attorney, Agent, or Firm*—Pillsbury Winthrop Shaw Pittman LLP

(57) ABSTRACT

A lithographic projection apparatus includes a support structure configured to hold a patterning device. The patterning device is configured to pattern a beam of radiation according to a desired pattern. The lithographic apparatus further includes a substrate table configured to hold a substrate. The substrate has a surface coated at least partially with a layer of radiation sensitive material. The lithographic apparatus also includes a projection system configured to project the patterned beam onto a target portion of the substrate, and a liquid supply system. The liquid supply system is configured to supply a prewetting liquid on top of the layer of radiation sensitive material to prewet the substrate, and is configured to supply an immersion liquid in a space between the prewet substrate and at least a portion of the projection system.

23 Claims, 7 Drawing Sheets

U.S. PATENT DOCUMENTS

| | | | |
|---|---|---|---|
| 4,480,910 A | 11/1984 | Takanashi et al. | 355/30 |
| 4,509,852 A | 4/1985 | Tabarelli et al. | 355/30 |
| 5,040,020 A | 8/1991 | Rauschenbach et al. | 355/53 |
| 5,121,256 A | 6/1992 | Corle et al. | 359/664 |
| 5,610,683 A | 3/1997 | Takahashi | 355/53 |
| 5,825,043 A | 10/1998 | Suwa | 250/548 |
| 5,900,354 A | 5/1999 | Batchelder | 430/395 |
| 6,191,429 B1 | 2/2001 | Suwa | 250/548 |
| 6,236,634 B1 | 5/2001 | Lee et al. | 369/112 |
| 6,600,547 B2 | 7/2003 | Watson et al. | 355/30 |
| 6,603,130 B1 | 8/2003 | Bisschops et al. | 250/492.1 |
| 7,196,770 B2 * | 3/2007 | Baselmans et al. | 355/53 |
| 2002/0020821 A1 | 2/2002 | Van Santen et al. | 250/492 |
| 2002/0163629 A1 | 11/2002 | Switkes et al. | 355/53 |
| 2003/0123040 A1 | 7/2003 | Almogy | 355/69 |
| 2004/0000627 A1 | 1/2004 | Schuster | 250/201.2 |
| 2004/0075895 A1 | 4/2004 | Lin | 359/380 |
| 2004/0114117 A1 | 6/2004 | Bleeker | 355/53 |
| 2004/0136494 A1 | 7/2004 | Lof et al. | 378/34 |
| 2004/0160582 A1 | 8/2004 | Lof et al. | 355/30 |
| 2004/0165159 A1 | 8/2004 | Lof et al. | 355/30 |
| 2004/0207824 A1 | 10/2004 | Lof et al. | 355/30 |
| 2004/0211920 A1 | 10/2004 | Derksen et al. | 250/492.1 |
| 2004/0239954 A1 | 12/2004 | Bischoff | 356/635 |
| 2004/0263809 A1 | 12/2004 | Nakano | 355/30 |
| 2005/0007569 A1 | 1/2005 | Streefkerk et al. | 355/30 |
| 2005/0018155 A1 | 1/2005 | Cox et al. | 355/30 |
| 2005/0024609 A1 | 2/2005 | De Smit et al. | 355/18 |
| 2005/0030497 A1 | 2/2005 | Nakamura | 355/30 |
| 2005/0046813 A1 | 3/2005 | Streefkerk et al. | 355/30 |
| 2005/0046934 A1 | 3/2005 | Ho et al. | 359/380 |
| 2005/0052632 A1 | 3/2005 | Miyajima | 355/53 |
| 2005/0068499 A1 * | 3/2005 | Dodoc et al. | 353/10 |
| 2005/0094116 A1 | 5/2005 | Flagello et al. | 355/53 |
| 2005/0094125 A1 | 5/2005 | Arai | 355/72 |
| 2005/0122505 A1 | 6/2005 | Miyajima | 355/72 |
| 2005/0132914 A1 | 6/2005 | Mulkens et al. | 101/463.1 |
| 2005/0134817 A1 | 6/2005 | Nakamura | 355/53 |
| 2005/0140948 A1 | 6/2005 | Tokita | 355/30 |
| 2005/0146693 A1 | 7/2005 | Ohsaki | 355/30 |
| 2005/0146694 A1 | 7/2005 | Tokita | 355/30 |
| 2005/0151942 A1 | 7/2005 | Kawashima | 355/30 |
| 2005/0200815 A1 | 9/2005 | Akamatsu | 353/53 |
| 2005/0205108 A1 * | 9/2005 | Chang et al. | 134/1 |
| 2005/0213065 A1 | 9/2005 | Kitaoka | 355/53 |
| 2005/0213066 A1 | 9/2005 | Sumiyoshi | 355/53 |
| 2005/0219489 A1 | 10/2005 | Nei et al. | 355/53 |
| 2005/0233081 A1 | 10/2005 | Tokita | 427/256 |
| 2005/0237504 A1 * | 10/2005 | Nagasaka et al. | 355/53 |
| 2008/0073602 A1 * | 3/2008 | Jacobs et al. | 250/548 |

FOREIGN PATENT DOCUMENTS

| | | |
|---|---|---|
| DE | 221 563 | 4/1985 |
| DE | 224 448 | 7/1985 |
| DE | 242 880 | 2/1987 |
| EP | 0023231 | 2/1981 |
| EP | 0418427 | 3/1991 |
| EP | 1039511 | 9/2000 |
| FR | 2474708 | 7/1981 |
| JP | 58-202448 | 11/1983 |
| JP | 62-065326 | 3/1987 |
| JP | 62-121417 | 6/1987 |
| JP | 63-157419 | 6/1988 |
| JP | 04-305915 | 10/1992 |
| JP | 04-305917 | 10/1992 |
| JP | 06-124873 | 5/1994 |
| JP | 07-132262 | 5/1995 |
| JP | 07-220990 | 8/1995 |
| JP | 10-228661 | 8/1998 |
| JP | 10-255319 | 9/1998 |
| JP | 10-303114 | 11/1998 |
| JP | 10-340846 | 12/1998 |
| JP | 11-176727 | 7/1999 |
| JP | 11-233406 A | 8/1999 |
| JP | 2000-058436 | 2/2000 |
| JP | 2000-340490 A | 12/2000 |
| JP | 2001-091849 | 4/2001 |
| JP | 2004-193252 | 7/2004 |
| JP | 2004-207711 A | 7/2004 |
| JP | 2004-282023 A | 10/2004 |
| JP | 2006-005335 A | 1/2006 |
| JP | 2006-080403 A | 3/2006 |
| WO | WO 99/49504 | 9/1999 |
| WO | WO 2004/053596 A2 | 6/2004 |
| WO | WO 2004/053950 A1 | 6/2004 |
| WO | WO 2004/053951 A1 | 6/2004 |
| WO | WO 2004/053952 A1 | 6/2004 |
| WO | WO 2004/053953 A1 | 6/2004 |
| WO | WO 2004/053954 A1 | 6/2004 |
| WO | WO 2004/053955 A1 | 6/2004 |
| WO | WO 2004/053956 A1 | 6/2004 |
| WO | WO 2004/053957 A1 | 6/2004 |
| WO | WO 2004/053958 A1 | 6/2004 |
| WO | WO 2004/053959 A1 | 6/2004 |
| WO | WO 2004/055803 A1 | 7/2004 |
| WO | WO 2004/057589 A1 | 7/2004 |
| WO | WO 2004/057590 A1 | 7/2004 |
| WO | WO 2004/090577 | 10/2004 |
| WO | WO 2004/090633 | 10/2004 |
| WO | WO 2004/090634 | 10/2004 |
| WO | WO 2004/092830 | 10/2004 |
| WO | WO 2004/092833 | 10/2004 |
| WO | WO 2004/093130 | 10/2004 |
| WO | WO 2004/093159 | 10/2004 |
| WO | WO 2004/093160 | 10/2004 |
| WO | WO 2004/095135 | 11/2004 |
| WO | WO 2005/010611 | 2/2005 |
| WO | WO 2005/024517 | 3/2005 |

OTHER PUBLICATIONS

M. Switkes et al., "Immersion Lithography at 157 nm", J. Vac. Sci. Technol. B., Vol. 19, No. 6, Nov./Dec. 2001, pp. 2353-2356.

M. Switkes et al., "Immersion Lithography: Optics for the 50 nm Node", 157 Anvers-1, Sep. 4, 2002.

B.J. Lin, "Drivers, Prospects and Challenges for Immersion Lithography", TSMC, Inc., Sep. 2002.

B.J. Lin, "Proximity Printing Through Liquid", IBM Technical Disclosure Bulletin, vol. 20, No. 11B, Apr. 1978, p. 4997.

B.J. Lin, "The Paths to Subhalf-Micrometer Optical Lithography", SPIE vol. 922, Optical/Laser Microlithography (1988), pp. 256-269.

G.W.W. Stevens, "Reduction of Waste Resulting from Mask Defects", Solid State Technology, Aug. 1978, vol. 21 008, pp. 68-72.

S. Owa et al., "Immersion Lithography; its potential performance and issues", SPIE Microlithography 2003, 5040-186, Feb. 27, 2003.

S. Owa et al., "Advantage and Feasibility of Immersion Lithography", Proc. SPIE 5040 (2003).

Nikon Precision Europe GmbH, "Investor Relations—Nikon's Real Solutions", May 15, 2003.

H. Kawata et al., "Optical Projection Lithography using Lenses with Numerical Apertures Greater than Unity", Microelectronic Engineering 9 (1989), pp. 31-36.

J.A. Hoffnagle et al., "Liquid Immersion Deep-Ultraviolet Interferometric Lithography", J. Vac. Sci. Technol. B., vol. 17, No. 6, Nov./Dec. 1999, pp. 3306-3309.

B.W. Smith et al., "Immersion Optical Lithography at 193nm", Future FAB International, vol. 15, Jul. 11, 2003.

H. Kawata et al., "Fabrication of 0.2μm Fine Patterns Using Optical Projection Lithography with an Oil Immersion Lens", Jpn. J. Appl. Phys. vol. 31 (1992), pp. 4174-4177.

G. Owen et al., "1/8μm Optical Lithography", J. Vac. Sci. Technol. B., vol. 10, No. 6, Nov./Dec. 1992, pp. 3032-3036.

H. Hogan, "New Semiconductor Lithography Makes a Splash", Photonics Spectra, Photonics TechnologyWorld, Oct. 2003 Edition, pp. 1-3.

S. Owa and N. Nagasaka, "Potential Performance and Feasibility of Immersion Lithography", NGL Workshop 2003, Jul. 10, 2003, Slide Nos. 1-33.

S. Owa et al., "Update on 193nm immersion exposure tool", Litho Forum, International Sematech, Los Angeles, Jan. 27-29, 2004, Slide Nos. 1-51.

H. Hata, "The Development of Immersion Exposure Tools", Litho Forum, International Sematech, Los Angeles, Jan. 27-29, 2004, Slide Nos. 1-22.

T. Matsuyama et al., "Nikon Projection Lens Update", SPIE Microlithography 2004, 5377-65, Mar. 2004.

"Depth-of-Focus Enhancement Using High Refractive Index Layer on the Imaging Layer", IBM Technical Disclosure Bulletin, vol. 27, No. 11, Apr. 1985, p. 6521.

A. Suzuki, "Lithography Advances on Multiple Fronts", EEdesign, EE Times, Jan. 5, 2004.

B. Lin, The $k_3$ coefficient in nonparaxial $\lambda$/NA scaling equations for resolution, depth of focus, and immersion lithography, *J. Microlith., Microfab., Microsyst.* 1(1):7-12 (2002).

English translation of Japanese Official Action issued on Nov. 21, 2008 in Japanese Application No. 2005-352933.

* cited by examiner

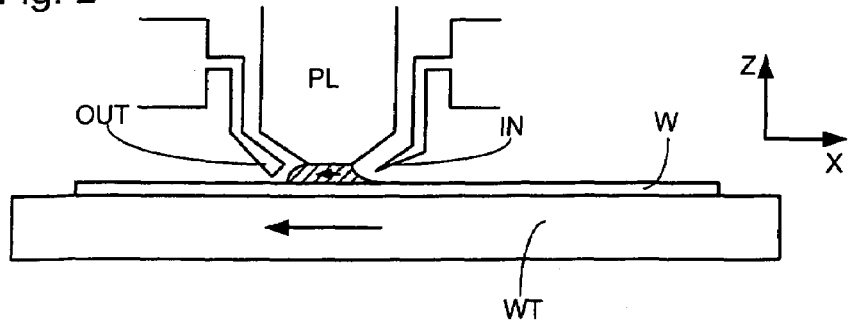
Fig. 2
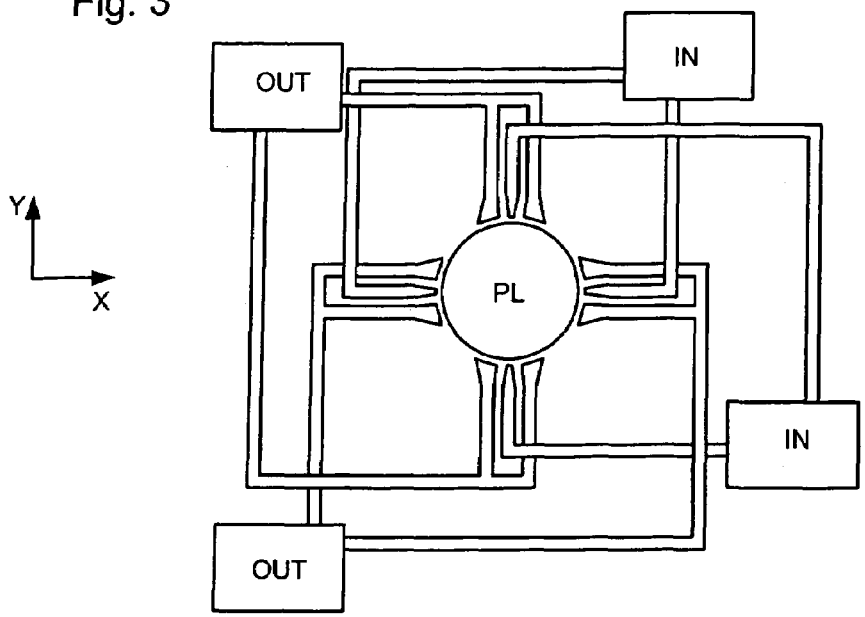
Fig. 3
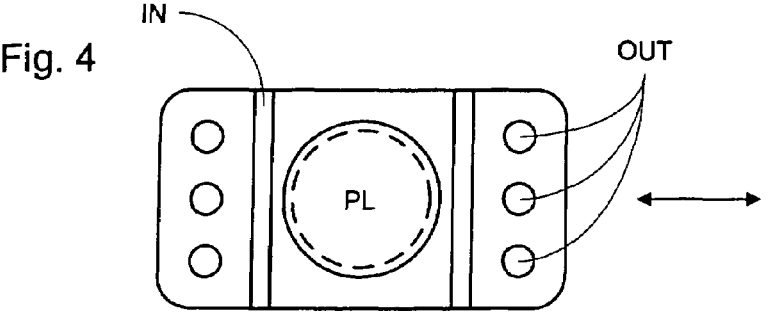
Fig. 4
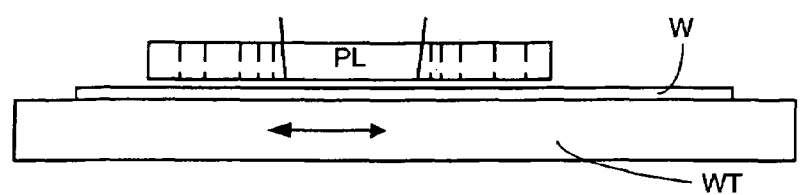

PREWETTING OF SUBSTRATE BEFORE IMMERSION EXPOSURE

This application is a divisional of U.S. patent application Ser. No. 11/005,219, filed Dec. 7, 2004, now U.S. Pat. No. 7,196,770 the entire contents of which is herein incorporated by reference.

FIELD

The present invention relates to a lithographic apparatus and in particular to an immersion lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid (referred to as an "immersion liquid") having a relatively high refractive index, e.g. water, so as to fill a space between the final element of the projection system and the substrate. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein.

However, submersing the substrate or substrate and substrate table in a bath of liquid (see for example United States patent U.S. Pat. No. 4,509,852, hereby incorporated in its entirety by reference) means that there is a large body of liquid that must be accelerated during a scanning exposure. This requires additional or more powerful motors and turbulence in the liquid may lead to undesirable and unpredictable effects.

One of the solutions proposed is for a liquid supply system to provide liquid (also referred to as an "immersion liquid") on only a localized area of the substrate and in between the final element of the projection system and the substrate (the substrate generally has a larger surface area than the final element of the projection system). One way which has been proposed to arrange for this is disclosed in PCT patent application no. WO 99/49504, hereby incorporated in its entirety by reference. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

SUMMARY

In conventional immersion lithography, the substrate coated with a radiation sensitive layer or resist layer is brought in contact with the immersion liquid only when the substrate is exposed to radiation.

However, due to the "hydrophobic" nature of the resist, the substrate resist layer has a tendency to repel the immersion liquid at the interface between the liquid and the resist layer on the substrate. As a result, gas (e.g., air) may be trapped between the resist layer and the liquid interface. Furthermore, on a microscopic scale, the surface of resist layer, albeit finished to be substantially flat, is not perfectly flat and has a topography that increases the chance of having gas trapped inside crevices in the topography of the surface of the resist layer. The gas trapped between the resist layer and the liquid interface can lead to formation of gas bubbles which can lead to printable defects on the resist layer as well as alter the characteristics of the radiation reaching the resist layer. The presence of gas bubbles or any other impurity in the path of the radiation and in particular at the surface of the resist layer, can seriously affect the imaging quality, for example, by being within the depth of focus.

According to an aspect of the present invention, there is provided A device manufacturing method, comprising applying, in a lithographic apparatus, a prewetting liquid on top of a layer of radiation sensitive material of a substrate, on a substrate table, or on both, providing an immersion liquid for use in projecting a patterned beam of radiation on the prewet substrate and/or substrate table, and projecting a patterned beam of radiation, through the immersion liquid, onto the substrate and/or the substrate table.

In an embodiment of the invention, the prewetting liquid has substantially a same chemical composition as the immersion liquid. The prewetting liquid may comprise, for example, water or a topcoat. The immersion liquid may comprise water, for example.

In an embodiment of the invention, applying the prewetting liquid reduces bubbles of gas trapped between ridges in a surface of the radiation sensitive material. In an embodiment of the invention, applying the prewetting liquid on the substrate fills voids in a surface of the radiation sensitive material with the prewetting liquid. In an embodiment of the invention, substantially all chemicals, particles, or both of the radiation sensitive material are leached into the prewetting liquid. In an embodiment of the invention, applying the prewetting liquid renders a surface of the radiation sensitive material compatible with the immersion liquid. In an embodiment of the invention, applying the prewetting liquid renders a surface of the radiation sensitive material less repellent to the immersion liquid. In an embodiment of the invention, the prewetting liquid is at least partially transparent to the patterned beam of radiation.

The method may further include removing prewetting liquid from the prewet substrate before providing the immersion liquid.

Another aspect of the present invention is to provide a lithographic projection apparatus. The lithographic projection apparatus includes a support structure configured to hold a patterning device. The patterning device is configured to pattern a beam of radiation according to a desired pattern. The lithographic projection apparatus. also includes a substrate table configured to hold a substrate. The substrate has a surface coated at least partially with a layer of radiation sensitive material. The lithographic projection apparatus further includes a projection system configured to project the patterned beam onto a target portion of the substrate, and a liquid supply system. The liquid supply system is configured to supply a prewetting liquid on top of the layer of radiation sensitive material to prewet the substrate, and is configured to supply an immersion liquid in a space between the prewet substrate and at least a portion of the projection system.

In an embodiment of the invention, the prewetting liquid has substantially a same chemical composition as the immersion liquid. The prewetting liquid may comprise, for example, water or a top coat. The immersion liquid may comprise, for example, water.

In an embodiment of the invention, the prewetting liquid is at least partially transparent to the patterned beam.

In an embodiment of the invention, the liquid supply system is configured to supply the prewetting liquid at a substantially same location in the apparatus as the immersion liquid. In an embodiment of the invention, the liquid supply system comprises a first liquid supply structure configured to supply the prewetting liquid at a first location in the apparatus and a second liquid supply structure configured to supply the immersion liquid at a second location in the apparatus. The first location can be a location of a measuring station in the apparatus. The second location can be allocation of an exposure station in the apparatus.

In an embodiment of the present invention, the liquid supply system includes an inlet connected to a liquid reservoir adapted to supply liquid to a surface of the substrate and an outlet connected to a pump adapted to remove liquid from the surface of the substrate. The liquid supply may also include an outlet configured to remove prewetting liquid from the prewet substrate before supply of immersion liquid to the prewet substrate.

A further aspect of the present invention is to provide a method of preparing a substrate provided at least partially with a layer of radiation sensitive material, prior to applying an immersion liquid to the substrate and exposing the substrate to a patterned beam of radiation in an immersion lithographic apparatus. The method includes coating at least a portion of a surface of the layer of radiation sensitive material with a liquid chemical non-sensitive to the patterned beam of radiation, the liquid chemical remaining in liquid form at least until application of the immersion liquid in the apparatus in the immersion lithographic apparatus.

In an embodiment of the invention, the liquid chemical is less repellent to the immersion liquid applied in the apparatus than the radiation sensitive material is to the immersion liquid. The liquid chemical may have substantially a same chemical composition as the immersion liquid.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 2 and 3 depict a liquid supply system for use in a lithographic projection apparatus;

FIG. 4 depicts another liquid supply system for use in a lithographic projection apparatus;

DETAILED DESCRIPTION

Figure 1:
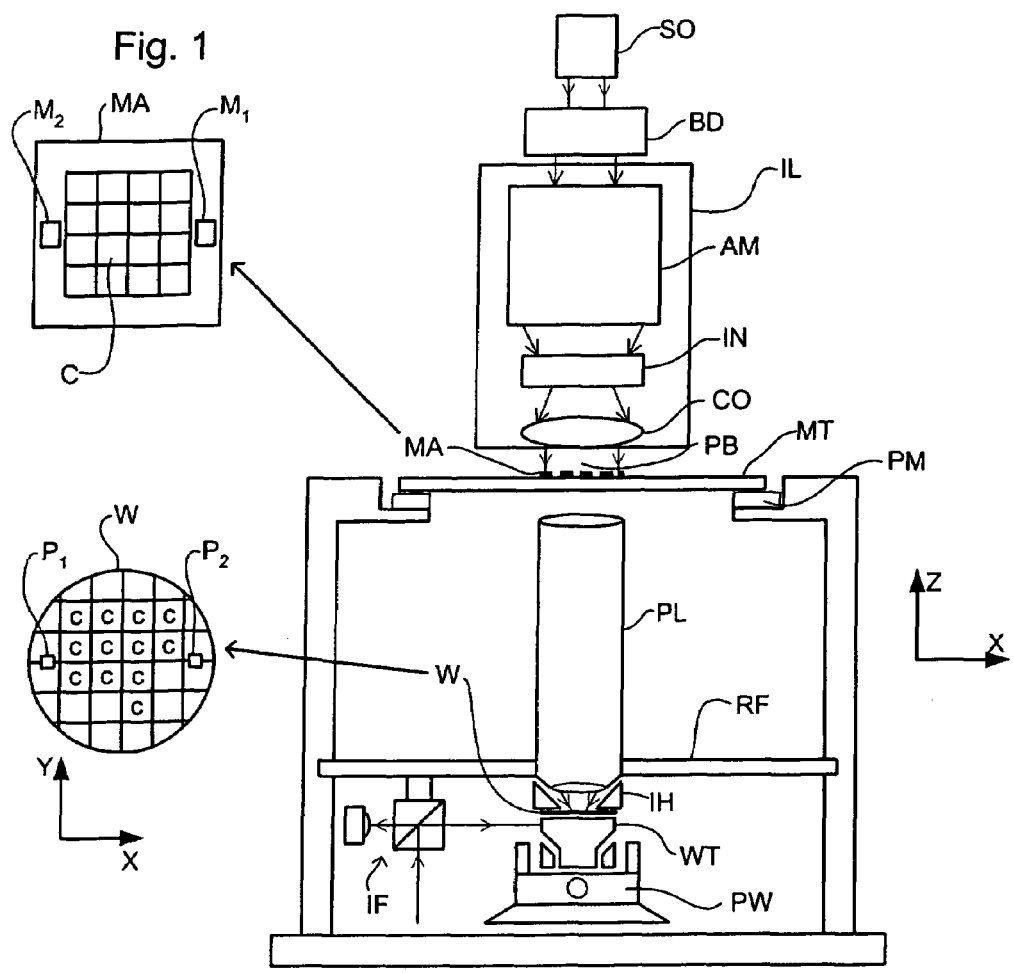
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam PB (e.g. UV radiation or DUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PL configured to project a pattern imparted to the radiation beam PB by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam PB is incident on the patterning device (e.g., mask MA), which is held on the support structure (e.g., mask table MT), and is patterned by the patterning device. Having traversed the mask MA, the radiation beam PB passes through the projection system PL, which focuses the beam onto a target portion C of the substrate W. An immersion hood IH, which is described further below, supplies immersion liquid to a space between the final element of the projection system PL and the substrate W.

With the aid of the second positioner PW and position sensor IF (e.g. an interferometric device, linear encoder or capacitive sensor), the substrate table WT can be moved accurately, e.g. so as to position different target portions C in the path of the radiation beam PB. Similarly, the first positioner PM and another position sensor (which is not explicitly depicted in FIG. 1) can be used to accurately position the mask MA with respect to the path of the radiation beam PB, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks).

Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

A further immersion lithography solution with a localized liquid supply system is shown in FIG. 4. Liquid is supplied by two groove inlets IN on either side of the projection system PL and is removed by a plurality of discrete outlets OUT arranged radially outwardly of the inlets IN. The inlets IN and OUT can be arranged in a plate with a hole in its center and through which the projection beam is projected. Liquid is supplied by one groove inlet IN on one side of the projection system PL and removed by a plurality of discrete outlets OUT on the other side of the projection system PL, causing a flow of a thin film of liquid between the projection system PL and the substrate W. The choice of which combination of inlet IN and outlets OUT to use can depend on the direction of movement of the substrate W (the other combination of inlet IN and outlets OUT being inactive).

Figure 5:
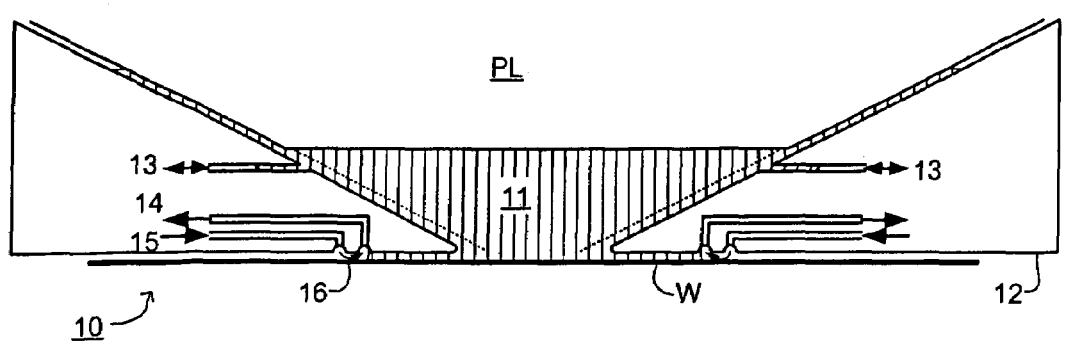
FIG. 5 depicts another liquid supply system for use in a lithographic projection apparatus.

Another immersion lithography solution with a localized liquid supply system solution which has been proposed is to provide the liquid supply system with a seal member which extends along at least a part of a boundary of the space between the final element of the projection system and the substrate table. Such a solution is illustrated in FIG. 5. The seal member is substantially stationary relative to the projection system in the XY plane though there may be some relative movement in the Z direction (in the direction of the optical axis). A seal is formed between the seal member and the surface of the substrate.

Referring to FIG. 5, reservoir 10 forms a contactless seal to the substrate around the image field of the projection system so that liquid is confined to fill a space between the substrate surface and the final element of the projection system. The reservoir is formed by a seal member 12 positioned below and surrounding the final element of the projection system PL. Liquid is brought into the space below the projection system and within the seal member 12. The seal member 12 extends a little above the final element of the projection system and the liquid level rises above the final element so that a buffer of liquid is provided. The seal member 12 has an inner periphery that at the upper end, in an embodiment, closely conforms to the shape of the projection system or the final element thereof and may, e.g., be round. At the bottom, the inner periphery closely conforms to the shape of the image field, e.g., rectangular though this need not be the case.

The immersion liquid is confined in the reservoir by a gas seal 16 between the bottom of the seal member 12 and the surface of the substrate W. The gas seal is formed by gas, e.g. air or synthetic air but, in an embodiment, $N_2$ or an inert gas, provided under pressure via inlet 15 to the gap between seal member 12 and substrate and extracted via first outlet 14. The overpressure on the gas inlet 15, vacuum level on the first outlet 14 and geometry of the gap are arranged so that there is a high-velocity gas flow inwards that confines the liquid. Such a system is disclosed in U.S. patent application Ser. No. 10/705,783, hereby incorporated in its entirety by reference.

Figure 6:
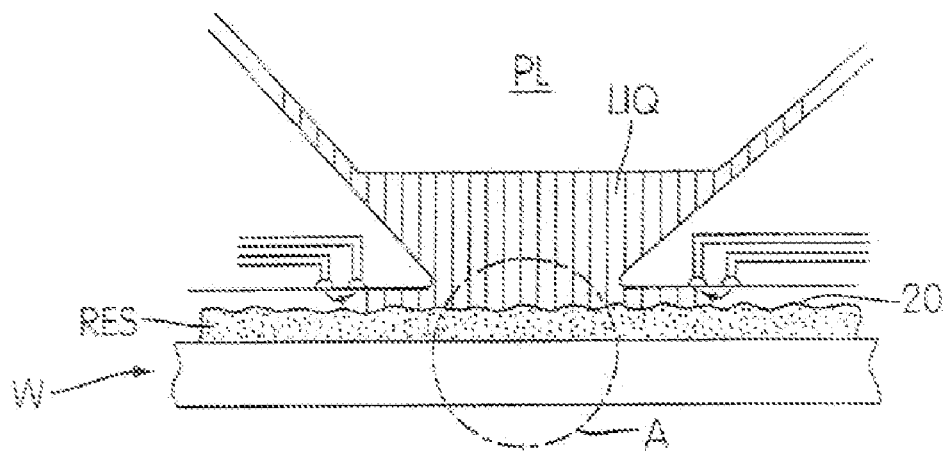
FIG. 6 depicts another liquid supply system in relation to a substrate and substrate table according to an embodiment of the present invention.

FIG. 6 is an enlargement of FIG. 5 around an exposure area of the substrate. FIG. 6 shows the substrate W ready for processing in a lithographic apparatus of, for example, FIG. 1. A layer of radiation sensitive material RES (i.e. the so called "resist" or "photoresist") is coated on top of a surface of the substrate W. The radiation sensitive material RES is approximately 200 nm thick. The resist layer RES, albeit finished to be substantially flat, is not perfectly flat and has a surface topography that has ridges 20.

Figure 7:
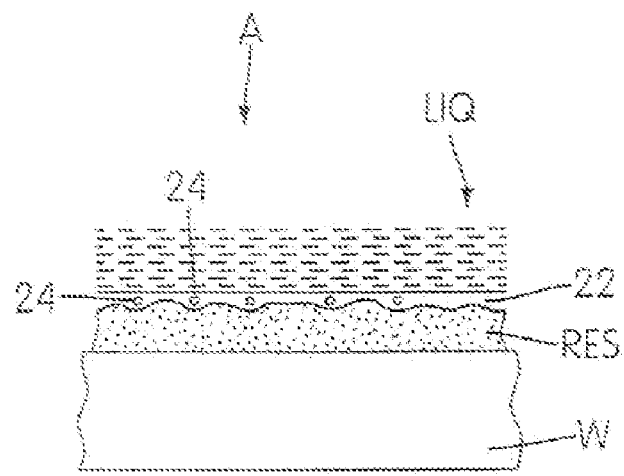
FIG. 7 is an enlargement of an area in FIG. 6.

Furthermore, as shown in FIG. 7 which is an enlargement of area A in FIG. 6, due to the "hydrophobic" nature of the material of the resist layer RES, the resist layer RES has a tendency to repel the immersion liquid LIQ at the interface 22 between the immersion liquid LIQ and the resist layer RES on the substrate W. In other words, the surface 20 of the resist RES has tendency of not wetting easily or completely. Therefore, in order to properly wet the surface 20 of the resist RES at the area of exposure, the immersion liquid may be kept for a certain length of time in contact with the resist RES to allow the proper wetting. However, this will require waiting a significant period of time for proper wetting of the area of exposure each time a new target portion C, i.e., dry portion, of the substrate W is positioned underneath the exposure system for irradiation. This situation may not be desirable as it will likely slow down the manufacturing process which will result in a loss in throughput.

Although the word "hydrophobic" meaning "repellent to water," is used, it must be appreciated that the immersion liquid is not limited to water but can be any suitable liquid. Thus, the word "hydrophobic" should be interpreted in this application in its broader sense to mean "repellent to liquid."

In addition, due to the ridged topography of the surface of the resist, bubbles of gas 24 may be trapped inside crevasses between ridges in the resist layer RES and a surface of immersion liquid LIQ. The gas bubbles trapped at the interface 22 between the immersion liquid LIQ and the resist layer RES may lead to printable defects on the resist layer RES and/or cause scattering of radiation passing through the liquid and thus alter the characteristics of the radiation reaching the resist layer while scanning. This can seriously affect the image quality exposed on the substrate. In addition, due to a ridged topography of a surface of the substrate table, bubbles of gas may also be trapped inside crevasses between ridges of the substrate table surface. The gas bubbles trapped in the surface of the substrate table, for example at an area where an image sensor is located on the surface of the substrate table, may also lead to errors in measurements.

Further, the bubbles may eventually be released from their traps with time or with motion of the liquid. Because in a localized liquid supply system a spot of liquid is moved from a target area of the substrate to another target area of the substrate for each exposure, it may require some waiting time for the bubbles to be sufficiently released at each new target area of the substrate. However, waiting for a certain time period at each exposure target area may render the scanning time excessively long. This is not desirable because manufacturing will be slowed and as a result throughput will suffer.

Another problem that may occur when the immersion liquid gets into contact with a surface of the resist layer is that one or more chemicals of the resist layer may leach into the liquid. The presence of a chemical inside the liquid may alter the physical and optical characteristic of the liquid, possibly leading to deterioration of imaging during scanning. The presence of a chemical inside the liquid may also lead to contamination of the projection system and thus to deterioration of imaging. A solution to this problem may be sufficiently flushing the liquid at each target location. However, this may be a time consuming task and even if the liquid is flushed, the liquid may still be "tainted" by the presence of a small amount of a chemical of the resist layer that leached into the liquid.

In order to overcome one or more of the above and other deficiencies, the resist layer RES may be prewet using a prewetting liquid PLIQ prior, for example, to bringing the substrate W into contact with the immersion liquid LIQ. The prewetting liquid PLIQ may be allowed to contact the resist layer RES substantially in its entirety and the ridged topography of the resist layer RES may thus be filled with the prewetting liquid PLIQ, as shown in FIG. 8. Furthermore, a surface of the substrate table may also be prewet using the prewetting liquid PLIQ. In this way, gas bubbles trapped in the surface of the substrate table, for example at an area where an image sensor is located on the surface of the substrate table, may be allowed to escape prior to moving the substrate table to the exposure station or taking a measurement in the measurement station.

Figure 8A:
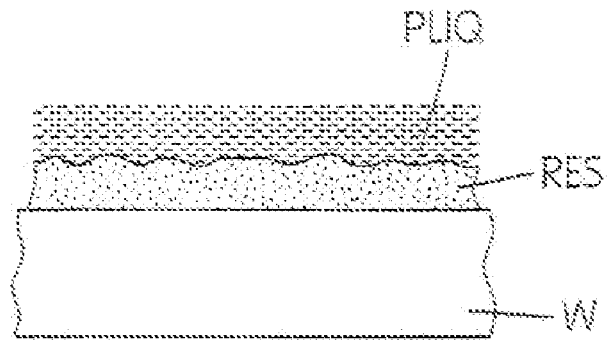
FIG. 8A depicts a substrate coated with a resist with a prewet liquid deposited on the resist.

As illustrated in FIG. 8A, which shows an enlargement of an area of the substrate, a prewetting liquid layer PLIQ is deposited on top of the resist layer RES, thus, filling substantially all the voids that may trap gas. As a result, gas bubbles that may be trapped in the voids in the ridged topography of the resist layer RES are displaced and the number of gas bubbles reduced. Further, waiting for bubbles to be released upon application of immersion liquid LIQ prior to exposing each target area of the substrate can be eliminated or reduced. As a result of prewetting the resist layer RES with prewetting liquid PLIQ, a faster and/or better exposure of the resist layer RES may be performed. Furthermore, by prewetting the resist layer RES with prewetting liquid PLIQ, one or more chemicals and/or particles of the resist layer RES may leach into the prewetting liquid PLIQ for a length of time. In an embodiment, the length of time may be such that a significant amount or substantially all of the amount of the one or more chemicals and/or particles can each have leached into the prewetting liquid PLIQ. Some or all of prewetting liquid PLIQ with the leached chemical(s) and/or particles may then be removed, for example, by displacement with immersion liquid LIQ. In this way, liquid through which the patterned beam is exposed will have a significantly reduced amount of leached chemical(s) and/or particles, that may detrimentally affect the image quality.

Figure 8B:
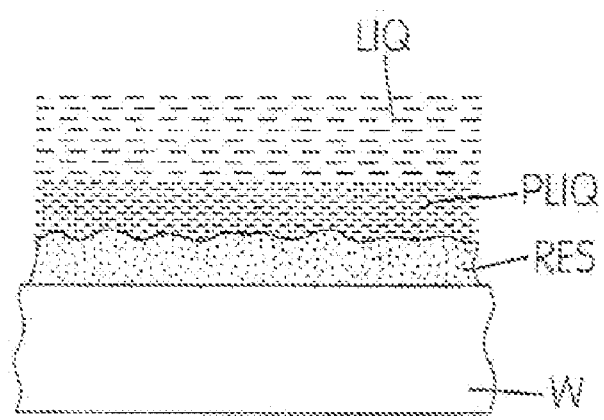
FIG. 8B depicts a substrate coated with a resist with a prewet liquid deposited on the resist and with an immersion liquid applied on the prewet resist.

As illustrated in FIG. 8B, once the prewetting liquid PLIQ is deposited on top of resist layer RES, the substrate W with the resist layer may then be brought in contact with the immersion liquid LIQ. The prewetting liquid PLIQ and the immersion liquid LIQ may have different chemical compositions. However, in an embodiment, the prewetting liquid PLIQ is selected to have substantially the same composition as the immersion liquid LIQ. This is done to ensure that the two liquids LIQ and PLIQ are more compatible. In an embodiment, the two liquids LIQ and PLIQ are maintained at a same temperature so as to reduce or eliminate any possible difference in the refractive index between the two liquids as any variation in the refractive index may reduce the imaging quality. In this way, providing immersion liquid LIQ to the resist layer RES that was previously prewet with prewetting liquid PLIQ should not have any problems that would otherwise arise if the immersion liquid and the prewetting liquid are incompatible.

By prewetting the substrate W with prewetting liquid PLIQ, a surface of the resist layer RES is rendered compatible with the immersion liquid. In other words, by prewetting the substrate with prewetting liquid PLIQ, a surface of resist layer is rendered less repellent to the immersion liquid LIQ. For example, the resist layer or a topcoat on the resist layer may be chemically activated such that the resist layer or topcoat is hydrolyzed and made more hydrophilic.

The immersion liquid is selected to be at least partially transparent to the radiation beam so that at least a portion of the radiation beam would reach the resist layer.

In an embodiment, the prewetting liquid PLIQ can be selected to comprise water and the immersion liquid LIQ can be selected to also comprise water. In another embodiment, the prewetting liquid is selected to comprise a topcoat, such as AQUATAR, manufactured by Clariant Corporation.

Prewetting all or part of the resist of the substrate is performed in the lithographic apparatus prior to exposing a target portion of the substrate to radiation. For example, in the embodiment shown in FIGS. 9A and 9B, the prewetting operation takes place at a station 30 in the lithographic apparatus prior to exposure of the substrate at an exposure station 32 in the lithographic apparatus. In this particular case, the station 30 includes a measurement station 30 which is a position of the substrate table WT (shown for example in FIG. 1) in the lithographic apparatus at which measurement and/or various alignment operations of the substrate table WT and/or the substrate W take place. Measurement systems are used at the measurement station 30 which include, for example, measurement sensors 34 (e.g. optical encoders, capacitive sensors, etc.). The exposure station 32 is a position in the lithographic apparatus where the exposure of the substrate W to radiation through the projection lens system takes place. In an embodiment, station 30 may be a prealignment station 30 where the substrate is prealigned, typically inside a substrate handling chamber in the lithographic apparatus, prior to being disposed by a substrate handler robot on the substrate table WT, for example. Generally the station 30 may be almost any location or locations in the lithographic apparatus including the substrate handling chamber, so long as a portion of the substrate can be prewet before supply of the immersion liquid to and exposure of that portion of the substrate, indeed, station 30 may be the exposure station 30. In an embodiment, the prewetting is performed "off line" at a position so that the time for the substrate to be wetted, bubbles removed, etc. will not hold up the lithographic process.

Figure 9A:
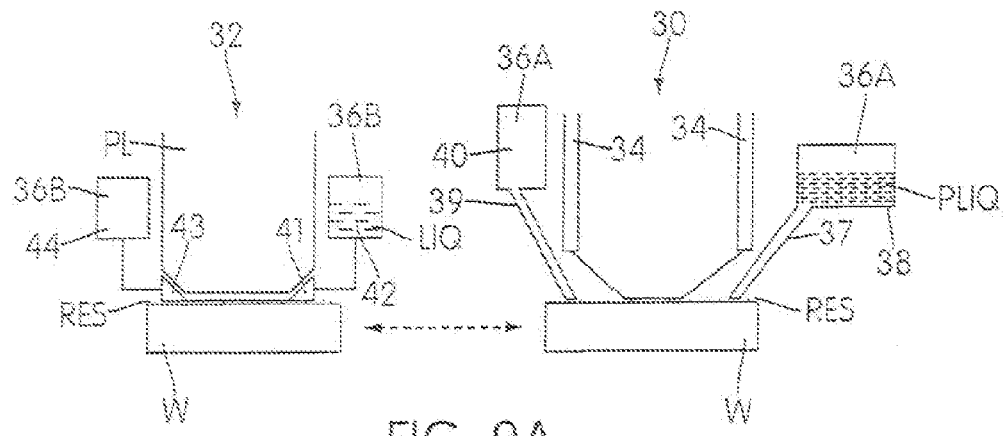
FIG. 9A is side view of a lithographic apparatus with a prewetting liquid supply system according to an embodiment of the invention.
Figure 9B:
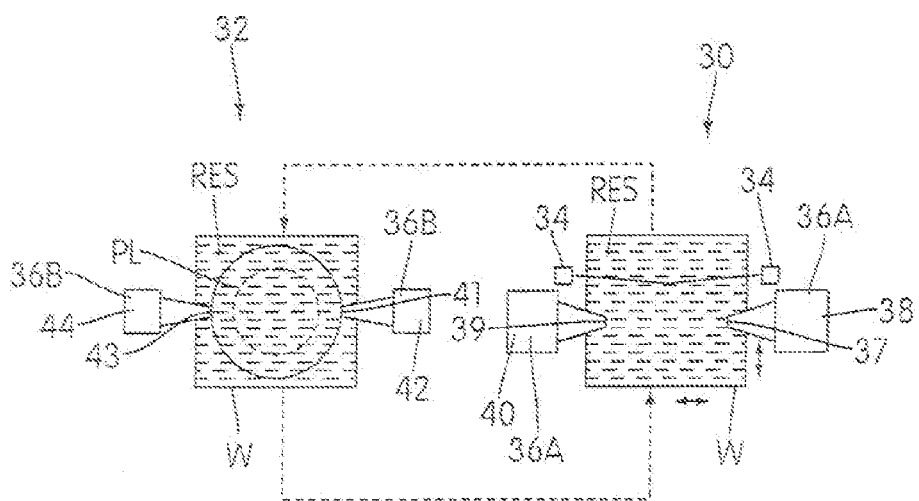
FIG. 9B is a top view of a lithographic apparatus with a prewetting liquid supply system according to an embodiment of the invention.

FIGS. 9A and 9B show an example in which two substrate tables WT are moved or swapped between station 30 and exposure station 32. FIGS. 9A and 9B show, respectively, side and top views of the exposure station 32 and the station 30. In this case, station 30 includes a measurement station. The swap of the two substrate tables WT is indicated in FIGS. 9A and 9B by a dotted line. In an embodiment, two substrate tables may move between two stations 30 and an exposure station 32, wherein one substrate table moves between one station 30 and the exposure station 32 and the other substrate table moves between the other station 30 and the exposure station 32 such that the two substrate tables alternately share the exposure station 32. A potential advantage of including such an arrangement in one lithographic apparatus is a possible increase in throughput, in that one substrate may be exposed while the next substrate to be exposed is being measured. For example, leveling measurements may be carried out with a table at a first position, without immersion liquid, and exposure is carried out with a table at a second position, where immersion liquid is present. Alternatively, the apparatus may have only one table in which case the measurement station and the exposure station may be at one location or at two locations as the substrate table moves between the locations.

A liquid supply system 36A, 36B is provided in the lithographic apparatus. The liquid supply structure 36A is configured to supply prewetting liquid PLIQ on top of resist layer RES at, for example, the measurement station 30 and the liquid supply structure 36B is configured to supply immersion liquid LIQ at the exposure station 32 in a space between the prewet substrate W and the projection system PL.

The liquid supply structure 36A comprises an inlet 37 connected to a liquid source 38 which contains the prewetting liquid PLIQ. The inlet 37 is adapted to apply liquid PLIQ on top of the resist layer RES. The liquid supply structure 36A further comprises an outlet 39 connected to a pump 40 so as to remove liquid PLIQ from resist layer RES.

The liquid supply structure 36B comprises an inlet 41 connected to a liquid source 42 which contains the immersion liquid LIQ. The inlet 41 is adapted to supply immersion liquid LIQ on top of the resist layer RES. The liquid supply system 36B further comprises an outlet 43 connected to a pump 44 to take up the immersion liquid LIQ. As stated above, the prewetting liquid and the immersion liquid LIQ can be the same, similar or completely different. In the case where the two liquids are different, the two liquids are dispensed from two different sources 38 and 42. In the case where the two liquids are the same, for example both liquids are water, then a single source of liquid may be used. Suitable piping may be provided to distribute the liquid to desired locations in the lithographic apparatus to prewet the substrate W in one location of the lithographic apparatus (e.g., the measurement station) and to provide immersion liquid between the projection system PL and the prewet substrate W in another location of the substrate (the exposure station).

Although the prewetting operation is described above as taking place at a measurement station, the prewetting may take place anywhere in the lithographic apparatus. For example, the prewet operation. can take place between the measurement station 30 and the exposure station 32, for example, during the operation of swapping of the two substrate tables WT.

In another example, the prewetting may take place at an exposure station in a localized liquid supply system immersion lithographic apparatus by prewetting specific target portions on the substrate before that target portion is exposed or by prewetting the substrate completely and then exposing each target portion thereafter.

Further, in an embodiment, outlet 30 and/or outlet 40 may be used to remove excess prewetting liquid. For example, prewetting liquid may come into contact with portions of the substrate or substrate table that should not be wet. In another embodiment, there may be too much liquid applied or liquid applied unevenly. Additionally, or alternatively, outlet 39 and/or outlet 40 may be used to remove most of the prewetting liquid so as to leave only a small portion of liquid filing the crevices of the resist layer. For example, a thin film of prewetting liquid of, for example, less than 2 µm may be left to fill the crevices of the resist. A thin film of prewetting liquid may be advantageous in helping reduce evaporative cooling that may otherwise occur if there is too much of prewetting liquid. Reducing evaporating cooling will help in minimizing ovelay problems. This may be advantageous, for example, to remove prewetting liquid containing leached chemical(s) and/or particles.

Figure 10:
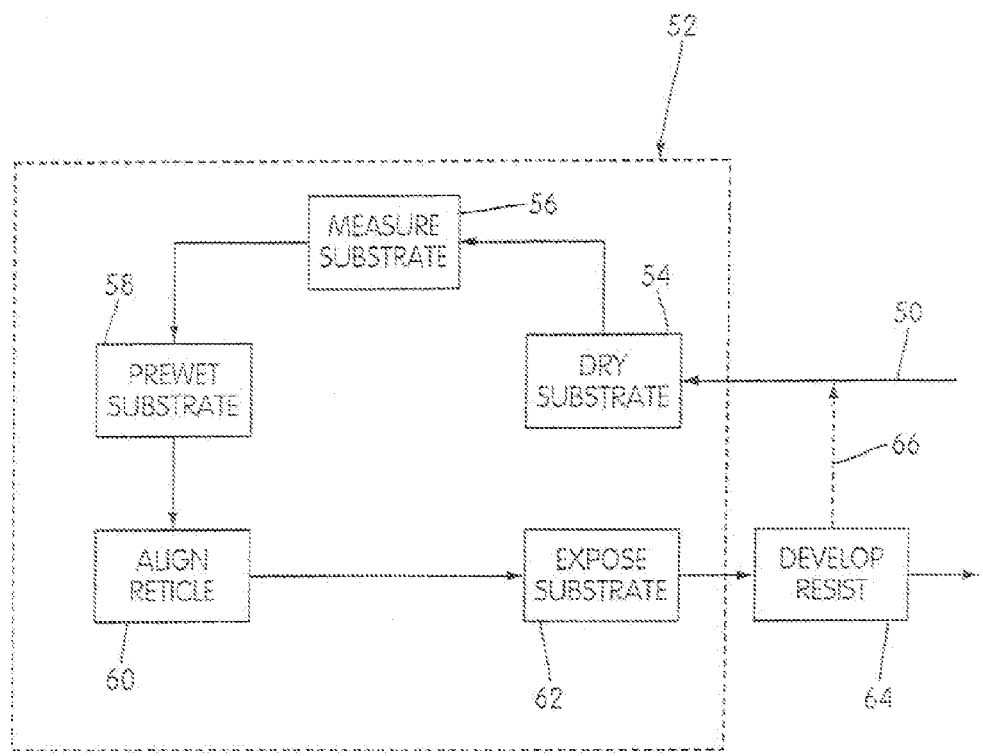
FIG. 10 shows a diagram of the various steps taking place in a lithographic apparatus during transfer of a substrate to and from prewetting according to an embodiment of the present invention.

FIG. 10 shows an example diagram of the various steps taking place in a lithographic apparatus during transfer of the substrate for prewetting and other procedures according to an embodiment of the present invention. The substrate is supplied via supply track 50 to a lithographic apparatus 52 with a layer of resist in a dry state (54). The substrate is positioned in a measurement station where various measurements are carried out on the substrate (56). The resist layer of the substrate is then prewet with the prewetting liquid (58), optionally after the substrate is sent to a prewetting station. After prewetting the resist layer of the substrate, the substrate is transferred to an exposure station where various alignment procedures are performed to align the mask or reticle with the substrate (60) and exposure of the substrate takes place (62). Although the prewetting of the substrate is shown, in this example, taking place prior to performing the various alignment procedures to align the mask with the substrate, it is also possible to prewet the substrate just before exposure of the substrate after performing the various alignment procedures. After exposing the substrate to radiation, the substrate is sent to a post exposure area so that the resist layer can be subjected to other procedures, such as a post-bake, development, a hard bake and measurement and/or inspection of the imaged features (64). This array of procedures may be used as a basis to pattern an individual layer of a device, for example an IC device. Such a patterned layer may then undergo various processes such as etching, ion-implantation or doping, metallization, oxidation, chemical/mechanical polishing, etc., all intended to finish off an individual layer. If several layers are required, then it may be necessary to repeat the whole procedure or a variant portion thereof, for each new layer, with overlay (juxtaposition) of the various stacked layers being performed as accurately as possible. The dashed arrow 66 in FIG. 10 indicates that the substrate may be sent back to the lithographic apparatus for further processing, i.e. for building other layers of the device. Eventually, an array of devices may be present on the substrate. These devices may then be separated from one another by a technique such as dicing or sawing. The devices may then be mounted on a carrier, connected to pins etc. Further information regarding such processes can be obtained, for example, from the book "Microchip Fabrication: A Practical Guide to Semiconductor Processing," Third Edition, by Peter van Zant, McGraw Hill Publishing Co., 1997, ISBN 0-07-067250-4.

While the discussion above has focused mostly on prewetting the substrate, it will be appreciated that other structures to which immersion liquid is applied for exposure to a patterned beam of radiation may be prewet. For example, a surface of the substrate table may be prewet. A particular example of a portion of the substrate table that may be prewet is a surface of a measurement sensor (such as a transmission image sensor or a dose sensor) or a measurement mark (such as an alignment grating) in or on the substrate table that is configured to be exposed to a patterned beam of radiation from the patterning device or patterned by a grating (e.g., an alignment mark).

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

While specific embodiments of the invention have been described above, it will be appreciated that the invention may be practiced otherwise than as described. For example, where applicable, the invention may take the form of a computer program containing one or more sequences of machine-readable instructions describing a method as disclosed above, or a data storage medium (e.g. semiconductor memory, magnetic or optical disk) having such a computer program stored therein.

One or more embodiments of the present invention may be applied to any immersion lithography apparatus, such as those types mentioned above, and whether the immersion liquid is provided in the form of a bath or only on a localized surface area of the substrate. A liquid supply system is any mechanism that provides a liquid to a space between the projection system and the substrate and/or substrate table. It may comprise any combination of one or more structures, one or more liquid inlets, one or more gas inlets, one or more gas outlets, and/or one or more liquid outlets, the combination providing and confining the liquid to the space. In an embodiment, a surface of the space may be limited to a portion of the substrate and/or substrate table, a surface of the space may completely cover a surface of the substrate and/or substrate table, or the space may envelop the substrate and/or substrate table. Furthermore, the immersion liquid used in the apparatus may have different compositions, according to the desired properties and the wavelength of exposure radiation used. For an exposure wavelength of 193 nm, ultra pure water or water-based compositions may be used and for this reason the immersion liquid is sometimes referred to as water and water-related terms such as hydrophilic, hydrophobic, humidity, etc. may be used.

The descriptions above are intended to be illustrative, not limiting. Thus, it will be apparent to one skilled in the art that modifications may be made to the invention as described without departing from the scope of the claims set out below.

We claim:

1. A device manufacturing method, comprising:
    applying, in a lithographic apparatus, a prewetting liquid on top of a layer of radiation sensitive material of a substrate, on a substrate table, or on both;
    providing an immersion liquid for use in projecting a patterned beam of radiation on the prewet substrate and/or substrate table to liquid-to-liquid contact the prewetting liquid; and
    projecting a patterned beam of radiation, through the immersion liquid, onto the substrate and/or the substrate table.

2. The method according to claim 1, wherein the prewetting liquid has substantially a same chemical composition as the immersion liquid.

3. The method according to claim 1, wherein the prewetting liquid comprises water.

4. The method according to claim 1, wherein the prewetting liquid comprises topcoat.

5. The method according to claim 4, wherein the topcoat includes fluoro alkyl acid, homopolymer and water.

6. The method according to claim 1, wherein the immersion liquid comprises water.

7. The method according to claim 1, wherein applying the prewetting liquid reduces bubbles of gas trapped between ridges in a surface of the radiation sensitive material and/or reduces bubbles of gas trapped between ridges in a surface of the substrate table.

8. The method according to claim 1, wherein applying the prewetting liquid fills voids in a surface of the radiation sensitive material with the prewetting liquid and/or fills voids in a surface of the substrate table.

9. The method according to claim 1, wherein substantially all chemicals, particles, or both of the radiation sensitive material are leached into the prewetting liquid.

10. The method according to claim 1, wherein applying the prewetting liquid renders a surface of the radiation sensitive material compatible with the immersion liquid.

11. The method according to claim 1, wherein applying the prewetting liquid renders a surface of the radiation sensitive material less repellent to the immersion liquid.

12. The method according to claim 1, wherein the prewetting liquid is at least partially transparent to the patterned beam of radiation.

13. The method according to claim 1, further comprising removing at least a portion of the prewetting liquid from the prewet substrate prior to providing the immersion liquid.

14. The method according to claim 1, wherein applying the prewetting liquid comprises supplying the prewetting liquid with a first liquid supply system and providing the immersion liquid comprises supplying the immersion liquid with a second liquid supply system.

15. The method according to claim 1, wherein applying the prewetting liquid comprises supplying the prewetting liquid at a first location in the lithographic apparatus and providing the immersion liquid comprises supplying the immersion liquid at a second location, displaced from the first location, in the lithographic apparatus.

16. The method according to claim 15, wherein the first location is a location of a measuring station in the lithographic apparatus and the second location is a location of an exposure station in the lithographic apparatus.

17. A device manufacturing method, comprising:
    applying, in a lithographic apparatus, a prewetting liquid on top of a layer of radiation sensitive material of a substrate, on a substrate table, or on both;
    providing an immersion liquid on to the prewetting liquid on the substrate and/or substrate table to liquid-to-liquid contact the prewetting liquid when the substrate and/or substrate table is under a projection system of the lithographic apparatus for exposure to a patterned beam of radiation; and
    projecting a patterned beam of radiation, through the immersion liquid, onto the substrate and/or the substrate table.

18. The method according to claim 17, wherein applying the prewetting liquid comprises supplying the prewetting liquid with a first liquid supply system and providing the immersion liquid comprises supplying the immersion liquid with a second liquid supply system.

19. The method according to claim 17, wherein applying the prewetting liquid comprises supplying the prewetting liquid at a first location in the lithographic apparatus and providing the immersion liquid comprises supplying the immersion liquid at a second location, displaced from the first location, in the lithographic apparatus.

20. The method according to claim 17, further comprising removing at least a portion of the prewetting liquid from the prewet substrate prior to providing the immersion liquid.

21. A method of preparing a substrate provided at least partially with a layer of radiation sensitive material, prior to applying an immersion liquid to the substrate and exposing the substrate to a patterned beam of radiation in an immersion lithographic apparatus, comprising:

coating at least a portion of a surface of the layer of radiation sensitive material with a liquid chemical non-sensitive to the patterned beam of radiation, the liquid chemical remaining in liquid form at least until application of the immersion liquid in the immersion lithographic apparatus to liquid-to-liquid contact the liquid chemical.

22. The method according to claim 21, wherein the liquid chemical is less repellent to the immersion liquid applied in the apparatus than the radiation sensitive material is to the immersion liquid.

23. The method according to claim 21, wherein the liquid chemical has substantially a same chemical composition as the immersion liquid.

* * * * *